(12) United States Patent
Morita

(10) Patent No.: US 6,525,793 B2
(45) Date of Patent: Feb. 25, 2003

(54) LIQUID CRYSTAL DISPLAY APPARATUS

(75) Inventor: Toshiyuki Morita, Tokyo (JP)

(73) Assignee: NEC Corporation, Tokyo (JP)

( * ) Notice: Subject to any disclaimer, the term of this patent is extended or adjusted under 35 U.S.C. 154(b) by 186 days.

(21) Appl. No.: 09/772,417

(22) Filed: Jan. 30, 2001

(65) Prior Publication Data

US 2001/0007486 A1 Jul. 12, 2001

(51) Int. Cl.[7] .............................................. G02F 1/1333
(52) U.S. Cl. ...................................... 349/122; 349/141
(58) Field of Search ........................ 349/122, 96, 106, 349/40, 141; 174/98; 348/820

(56) References Cited

U.S. PATENT DOCUMENTS

| | | | | |
|---|---|---|---|---|
| 5,281,365 A | * | 1/1994 | Sohn et al. | 106/286.4 |
| 5,318,724 A | * | 6/1994 | Hasegawa et al. | 106/1.25 |
| 6,147,738 A | * | 11/2000 | Okamoto | 349/122 |
| 6,166,795 A | * | 12/2000 | Fujii et al. | 349/111 |
| 6,180,030 B1 | * | 1/2001 | Hirai et al. | 252/512 |
| 6,335,051 B1 | * | 1/2002 | Kausch et al. | 252/585 |
| 6,404,120 B1 | * | 6/2002 | Aben et al. | 313/477 R |

FOREIGN PATENT DOCUMENTS

JP          10-96953          4/1998

* cited by examiner

*Primary Examiner*—Kenneth Parker
(74) *Attorney, Agent, or Firm*—Scully, Scott, Murphy & Presser

(57) ABSTRACT

A liquid crystal display apparatus, in which a backlight unit is mounted on one surface side thereof, and in which a liquid crystal is sealed between a pair of transparent substrates, includes a conductive film made of a high-resistance conductive agent and formed on an outer surface of a polarizing plate adhered to an outer surface of one of the pair of transparent substrates which is mounted on the side of the backlight unit so as to secure a surface resistance of from $1 \times 10^9$ ohm to $1 \times 10^{12}$ ohm for the polarizing plate.

7 Claims, 4 Drawing Sheets

LIQUID CRYSTAL DISPLAY APPARATUS

BACKGROUND OF THE INVENTION

1. Field of the Invention

This invention relates to a liquid crystal display apparatus and, more particularly, to a TFT liquid crystal display apparatus which prevents display non-uniformity caused by a non-uniform distribution of static electricity on the surface of the liquid crystal display apparatus.

2. Description of the Prior Art

FIG. 1 shows the section of a usual, conventional liquid crystal display apparatus. As shown in FIG. 1, a liquid crystal display apparatus 20 is constituted by a TFT substrate 22a which is made of, e.g., a transparent glass having an electrode on its inner surface, an opposite substrate 22b which is also made of, e.g., a transparent glass having an electrode on its inner surface and arranged in parallel to the TFT substrate 22a via a spacer/sealing member 24, a liquid crystal 26 liquid-tightly sealed among the pair of substrates 22a, 22b and the spacer/sealing member 24, a color filter 27 adhered to the inner surface of the opposite substrate 22b, a pair of polarizing plates 28 and 29 respectively adhered to the outer surfaces of the TFT substrate 22a and the opposite substrate 22b, and protective films 23 and 25 respectively adhered to the outer surfaces of the polarizing plates 28 and 29. The polarizing plates 28 and 29 are readily chargeable, and therefore when the protective films 23 and 25 respectively adhered to the outer surfaces of the pair of polarizing plates 28, 29 are peeled off during manufacturing processes of the liquid crystal display apparatus or just before use after the liquid crystal display apparatus has been forwarded to the user, static electricity is generated on the outer surfaces of the polarizing plates 28 and 29.

Since the polarizing plate 28 is formed of an insulating film, static electricity generated by peeling of the protective film 23 is locally electrified at a part of the outer surface of the polarizing plate 28, and this nonuniform static electricity causes display non-uniformity. An IPS (In-Plane Switching) liquid crystal panel uses the same polarizing plate as a TN (Twisted Nematic) liquid crystal panel. In the conventional panel, when the protective films 23 and 25 are peeled off, the removal of electrification of the static electricity is done for a long time to suppress display non-uniformity.

FIG. 2 is a plan view showing a conventional polarizing plate 40 when the surface is not coated with any high-resistance conductive agent, and the protective film is peeled off. When the protective film is peeled off, static electricity is generated on the surface of the polarizing plate 40. At this time, since the conventional polarizing plate 40 has a high surface resistance ($1 \times 10^{16}$ ohm or more), the generated static electricity is not uniformly distributed, and the potential locally increases, as shown in FIG. 2. These high-potential portions result in display non-uniformity, which requires the removal of electrification of the static electricity for a long time (about 1 min).

However, the long-time removal of electrification of the static electricity for suppressing display non-uniformity of the display apparatus decreases productivity, so the removal time of the electrification must be shortened. In the IPS panel, even if display non-uniformity is suppressed by the long-time removal of the electrification, static electricity may still be generated on the outer surface of the polarizing plate when the polarizing plate rubs against the backlight.

That is, if the polarizing plate contacts the diffusion sheet of the backlight due to vibration, shock, or the like after assembling the backlight, static electricity is generated on the outer surface of the polarizing plate. For the same reason as described above, the potential locally increases to generate electrified portions, resulting in display non-uniformity.

Another conventional liquid crystal display apparatus in which, in order to prevent the surface of the polarizing plate from generating a locally electrified portion due to the static electricity, an organic conductive film is formed on a polarizing plate is disclosed in Japanese Unexamined Patent Publication No. 10-96953. The organic conductive film used in this conventional liquid crystal display unit has a surface resistance of $1 \times 10^5$ ohm. However, in order to secure such a low surface resistance, the organic conductive film must be so formed as to have a remarkably high thickness even if the most suitable material for the organic conductive film, which is available at present, is used. As a result, it causes the organic conductive film to decrease its transparency, resulting in having a bad effect upon the liquid crystal display apparatus.

SUMMARY OF THE INVENTION

The present invention has been made in consideration of the conventional situation, and has as its object to provide a liquid crystal display apparatus in which static electricity is uniformly distributed on the surface of an IPS panel so as to prevent any display non-uniformity even when a protective film is peeled off.

In order to achieve the above object, according to the first aspect of the present invention, there is provided a liquid crystal display apparatus in which a backlight unit is mounted on one surface side thereof, and in which a liquid crystal is sealed between a pair of transparent substrates, comprising a conductive film made of a high-resistance conductive agent and formed on an outer surface of a polarizing plate adhered to an outer surface of one transparent substrate mounted on the side of said backlight unit so as to secure a surface resistance of from $1 \times 10^9$ ohm to $1 \times 10^{12}$ ohm for the polarizing plate.

According to the second aspect of the present invention, there is provided a liquid crystal display apparatus in which a backlight unit is mounted on one surface side thereof, in which a liquid crystal is sealed between a pair of transparent substrates, in which a color filter is adhered to an inner surface of one of said pair of transparent substrates, which is mounted on the side opposite to the side of said backlight unit, and in which polarizing plates are respectively adhered to outer surfaces of said pair of transparent substrates, comprising a conductive film made of a high-resistance conductive agent and formed on an outer surface of the polarizing plate adhered to an outer surface of one of said pair of transparent substrate mounted on the side of said backlight unit so as to secure a surface resistance of from $1 \times 10^9$ ohm to $1 \times 10^{12}$ ohm for the polarizing plate.

The high-resistance conductive agent in the first and second aspects has a composition of not more than 1% of a trialkyl-(2-hydroxyethyl) ammonium salt, not more than 10% of pentaerythritol, and not less than 90% of ethanol, or a composition of 5% of tin oxide, 2 to 5% of tetraethoxysilane, 1 to 2% of a polyester resin, and 87 to 90% of water.

The liquid crystal display apparatus in the first and second aspects may be an IPS panel.

According to the present invention having these aspects, the high-resistance conductive film is formed on the surface of the polarizing plate. Even if the protective film is peeled off from the polarizing plate, static electricity is not locally electrified on the polarizing plate, but is uniformly distributed, and no working time for removing static electricity is required.

Even if static electricity is generated between the liquid crystal display apparatus and backlight upon assembling the backlight, no display non-uniformity by the generated static electricity occurs.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF PREFERRED EMBODIMENT

A preferred embodiment of the present invention will be described below with reference to the accompanying drawings.

Figure 1:
FIG. 1 is a schematic sectional view showing a conventional liquid crystal display apparatus.
Figure 2:
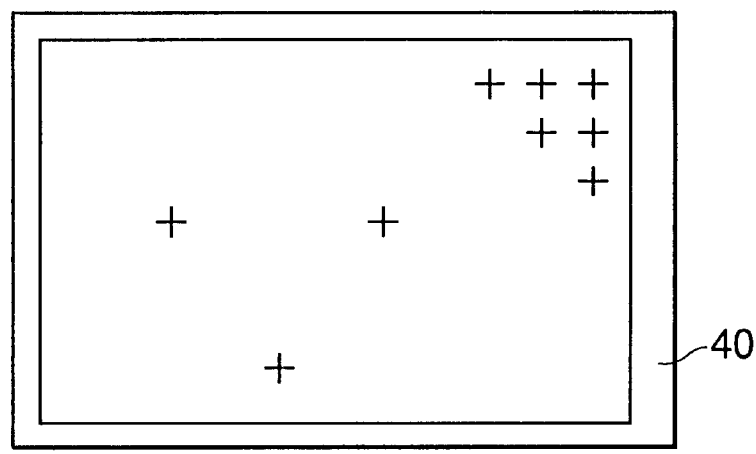
FIG. 2 is a plan view showing the distribution of static electricity in the conventional apparatus.
Figure 3:
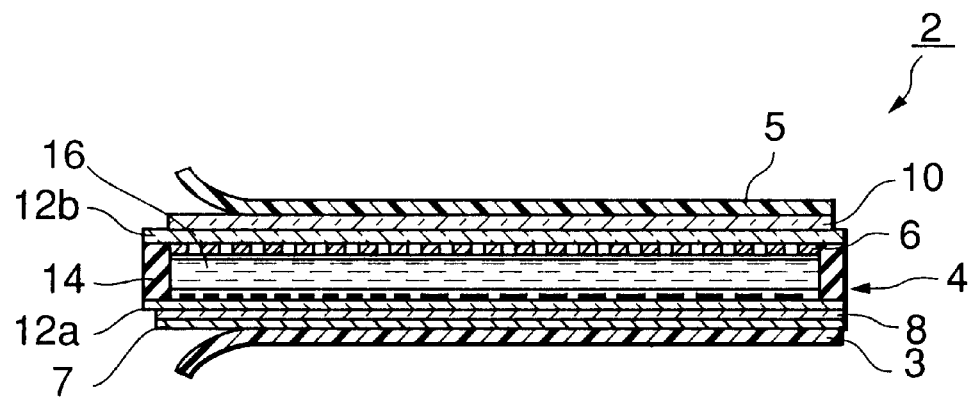
FIG. 3 is a schematic sectional view showing a liquid crystal display apparatus according to the present invention.

FIG. 3 shows an example of the structure of an IPS liquid crystal panel. In FIG. 3, reference numeral 2 denotes a liquid crystal display apparatus which is constituted by a liquid crystal section 4, a color filter 6, polarizing plates 8 and 10, protective films 3 and 5, and the like, similar to the conventional apparatus shown in FIG. 1.

The liquid crystal section 4 is composed of a pair of transparent glass substrates mounted in parallel to each other (that is, a TFT substrate 12a positioned at a lower side in FIG. 3 and an opposite substrate 12b positioned at an upper side in FIG. 3), a spacer/sealing member 14 and a liquid crystal 16 liquid-tightly sealed among them. Each of the substrates 12a and 12b has an electrode. Therefore, by applying a voltage between the electrodes, the liquid crystal 16 changes to form a character or image.

The color filter 6 is formed with many pixels, and adhered to the inner surface of the opposite substrate 12b.

The polarizing plates 8 and 10 are respectively adhered to the outer surfaces of the TFT substrate 12a and the opposite substrate 12b. The polarizing plates 8 and 10 are made up of multilayered insulating films, and their respective outer surfaces are covered with the protective films 3 and 5 in advance. The outer surface of the polarizing plate 8 adhered to the back surface of the TFT substrate 12a is formed with a conductive film 7 made of a conductive agent coated. That is, the outer surface of the polarizing plate 8 is coated with the conductive film 7, which is, in turn, covered with the protective film 3.

The conductive agent forming the conductive film 7 has a high resistance. The conductive film 7 is coated so as to provide a surface resistance of from $1\times10^9$ ohm to $1\times10^{12}$ ohm with itself. If the surface resistance of the conductive film 7 exceeds $1\times10^{12}$ ohm, static electricity generated on the surface of the polarizing plate 8 is not uniformly distributed, failing to suppress display non-uniformity resulting from the static electricity, on the other hand, if the surface resistance is less than $1\times10^9$ ohm, the conductive film 7 formed on the surface of the polarizing plate 8 becomes remarkably thick, resulting in a decrease in transmittance or thickness non-uniformity (coating non-uniformity).

A solvent for the conductive agent has a composition of 1% or less of a trialkyl-(2-hydroxyethyl) ammonium salt, 10% or less of pentaerythritol, and 90% or more of ethanol.

Note that another solvent for the conductive agent has a composition of 5% of tin oxide, 2 to 5% of tetraethoxysilane, 1 to 2% of a polyester resin, and 87 to 90% of water. The conductive film 7 is formed by applying such solvent to the surface of the polarizing plate 8 and drying the solvent.

A method of forming the conductive film 7 will be explained.

Figure 4:
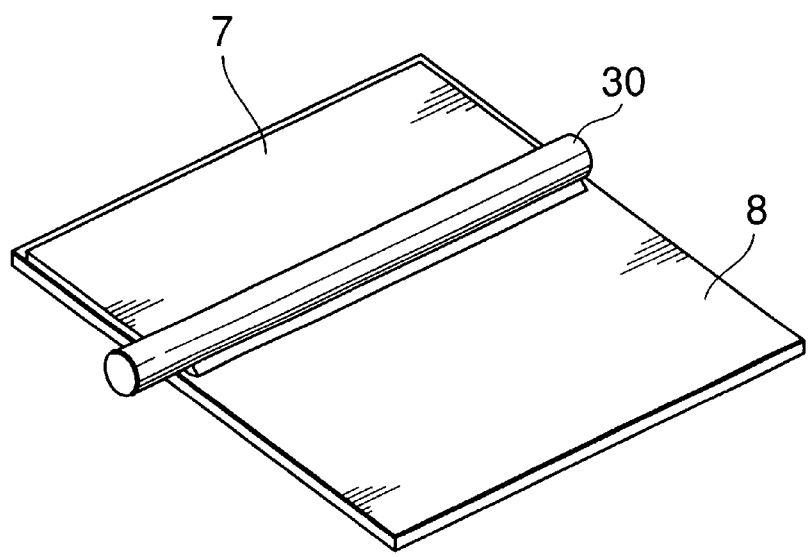
FIG. 4 is a perspective view showing a method of forming a conductive agent film.
Figure 5:
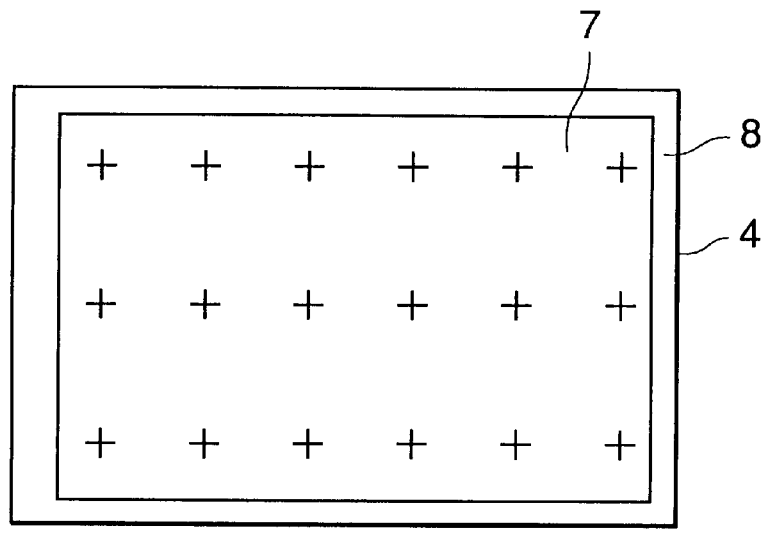
FIG. 5 is a plan view showing the distribution of static electricity.

As shown in FIG. 4, the solvent containing the conductive agent is applied to the surface of the polarizing plate using a jig generally called a bar coater 30. At this time, the solvent is diluted with ethanol or water so as to suppress coating non-uniformity and a decrease in transmittance. The dilution ratio is adjusted to apply a surface resistance of $1\times10^9$ ohm to $1\times10^{12}$ ohm to the conductive film 7 after coating. Usually, the dilution ratio of the solution and ethanol or water is 1:1.

Cancellation of display non-uniformity due to peeling of the protective film 3 will be described.

As shown in FIG. 3, when the protective film 3 on the polarizing plate 8 mounted on the side of the TFT substrate 12a, where the conductive film 7 is formed, is peeled off, static electricity is generated on the surface of the polarizing plate 8. However, the presence of the conductive film 7 prevents the potential from locally increasing, and the static electricity is uniformly distributed on the entire display surface of the polarizing plate 8. For this reason, the liquid crystal display apparatus does not require any long-time removal of electrification of the static electricity and is free from any display non-uniformity.

Figure 8:
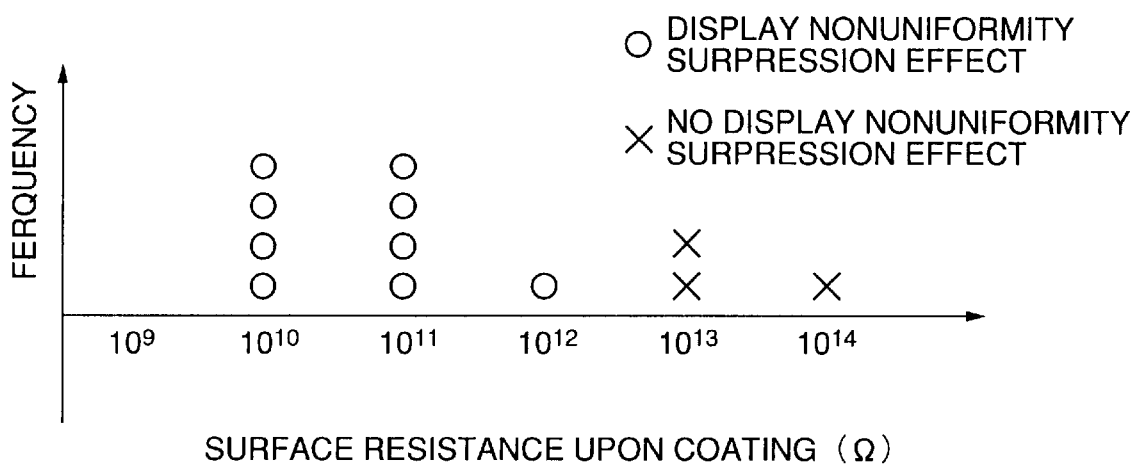
FIG. 8 is a graph showing the relationship between display non-uniformity and the resistance.

FIG. 8 shows the relationship between the surface resistance and occurrence of display non-uniformity. As is apparent from FIG. 8, display non-uniformity occurs at a surface resistance of $1\times10^{13}$ ohm or more. The conductive film 7 has a property of increasing its surface resistance by $1\times10^3$ ohm or more over time. From this relationship, the most preferable surface resistance upon coating is $1\times10^9$ ohm.

A backlight unit and cancellation of display non-uniformity will be described with reference to FIG. 6.

Figure 6:
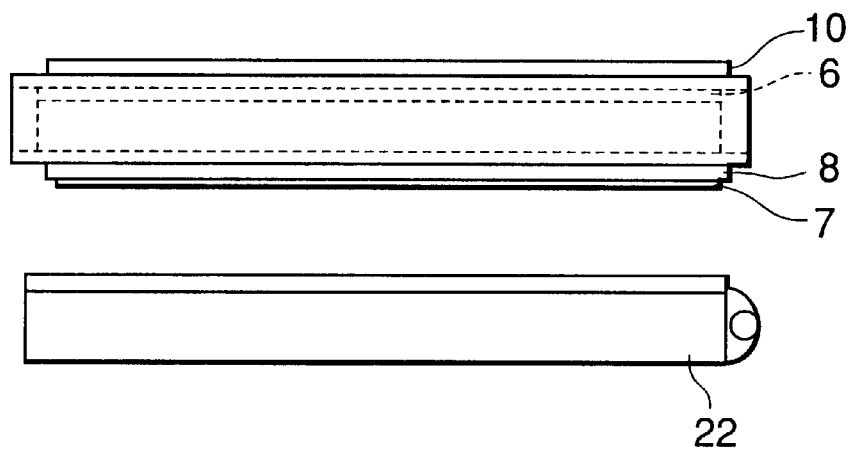
FIG. 6 is a schematic side view showing the liquid crystal display apparatus.

FIG. 6 shows the state in which a backlight unit 22 is assembled into the IPS panel adhered with the polarizing plate 8 having the conductive film 7. Assembly of the backlight unit 22 generates static electricity on the polarizing plate 8. However, the presence of the high-resistance conductive film 7 on the polarizing plate 8 prevents the potential from locally increasing, and the static electricity is uniformly distributed on the entire display surface. For this reason, even after the backlight unit 22 is assembled, occurrence of display non-uniformity by build-up of static electricity can be prevented.

Figure 7:
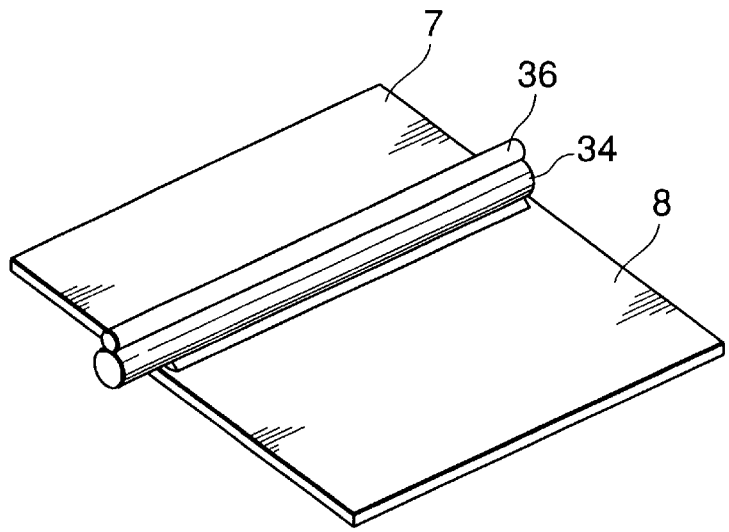
FIG. 7 is a perspective view showing another method of forming a conductive agent film.

FIG. 7 shows a photogravure method as another method of forming the conductive film 7. According to this photogravure method, a doctor roll 36 is brought into contact with a plate cylinder 34 to form a conductive film 7 on the surface of the polarizing plate.

Using this formation method, a solvent for the high-resistance conductive agent containing component (1): a trialkyl-(2-hydroxyethyl) ammonium salt, pentaerythritol, and ethanol, or component (2): tin oxide, tetraethoxysilane, a polyester resin, and water may be applied to adjust the surface resistance of the polarizing plate 8 mounted on the side of the backlight 22 into $1\times10^9$ ohm to $1\times10^{12}$ ohm. By this method, the same effects as described above can be obtained.

What is claimed is:

1. A liquid crystal display apparatus in which a backlight unit is mounted on one surface side thereof, and in which a liquid crystal is sealed between a pair of transparent substrates, comprising a conductive film made of a high-resistance conductive agent and formed on an outer surface of a polarizing plate adhered to an outer surface of one of said pair of transparent substrates which is mounted on the side of said backlight unit so as to secure a surface resistance of from $1\times10^9$ ohm to $1\times10^{12}$ ohm for said polarizing plate.

2. An apparatus according to claim 1, wherein the high-resistance conductive agent made employing not more than 1% of a trialkyl-(2-hydroxyethyl) ammonium salt, not more than 10% of pentaerythritol, and not less than 90% of ethanol.

3. An apparatus according to claim 1, wherein the high-resistance conductive agent made employing 5% of tin oxide, 2 to 5% of tetraethoxysilane, 1 to 2% of a polyester resin, and 87 to 90% of water.

4. A liquid crystal display apparatus in which a backlight unit is mounted on one surface side thereof, in which a liquid crystal is sealed between a pair of transparent substrates, in which a color filter is adhered to an inner surface of one of said pair of transparent substrates which is mounted on the side opposite to the side of said backlight unit, and in which polarizing plates are respectively adhered to outer surfaces of said pair of transparent substrates, comprising a conductive film made of a high-resistance conductive agent and formed on an outer surface of the polarizing plate adhered to an outer surface of one of said pair of transparent substrates which is mounted on the side of said backlight unit so as to secure a surface resistance of from $1\times10^9$ ohm to $1\times10^{12}$ ohm for said polarizing plate.

5. An apparatus according to claim 4, wherein the high-resistance conductive agent made employing not more than 1% of a trialkyl-(2-hydroxyethyl) ammonium salt, not more than 10% of pentaerythritol, and not less than 90% of ethanol.

6. An apparatus according to claim 4, wherein the high-resistance conductive agent made employing 5% of tin oxide, 2 to 5% of tetraethoxysilane, 1 to 2% of a polyester resin, and 87 to 90% of water.

7. An apparatus according to claim 4, wherein said liquid crystal display apparatus is an IPS panel.

* * * * *